(12) United States Patent
Landig et al.

(10) Patent No.: US 12,155,297 B2
(45) Date of Patent: Nov. 26, 2024

(54) HIGH VOLTAGE OPTICAL TRANSFORMER INTEGRATION

(71) Applicant: META PLATFORMS TECHNOLOGIES, LLC, Menlo Park, CA (US)

(72) Inventors: Renate Eva Klementine Landig, Seattle, WA (US); Jonathan Robert Peterson, Woodinville, WA (US); Maik Andre Scheller, Redmond, WA (US); Christopher Yuan Ting Liao, Seattle, WA (US); Andrew John Ouderkirk, Kirkland, WA (US); Daniele Piazza, Menlo Park, CA (US); Yigit Menguc, Redmond, WA (US); Tianshu Liu, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 932 days.

(21) Appl. No.: 17/123,674

(22) Filed: Dec. 16, 2020

(65) Prior Publication Data

US 2022/0103063 A1 Mar. 31, 2022

Related U.S. Application Data

(60) Provisional application No. 63/084,592, filed on Sep. 29, 2020.

(51) Int. Cl.
*H02M 3/00* (2006.01)
*G02B 3/12* (2006.01)
(Continued)

(52) U.S. Cl.
CPC ............. *H02M 3/00* (2013.01); *G21K 5/00* (2013.01); *H01L 23/3114* (2013.01);
(Continued)

(58) Field of Classification Search
CPC .......... H02M 3/00; H02M 3/156; G21K 5/00; H01L 23/3114; H01L 23/562;
(Continued)

(56) References Cited

U.S. PATENT DOCUMENTS 4,730,115 A 3/1988 Abe
5,059,910 A * 10/1991 Ochi ................... G01R 15/24
324/72

(Continued)

FOREIGN PATENT DOCUMENTS

FR 2525831 A1 10/1983

OTHER PUBLICATIONS

Sun et al., "Ion-Beam Modified Terahertz GaAs Photoconductive Antenna", URL: https://www.intechopen.com/books/advances-in-photodetectors-research-and-applications/ion-beam-modified-terahertz-gaas-photoconductive-antenna, Intechopen, Jan. 12, 2019, pp. 1-22.

(Continued)

*Primary Examiner* — Seung C Sohn
(74) *Attorney, Agent, or Firm* — Greenberg Traurig, LLP

(57) ABSTRACT

A high voltage-driven system includes a high voltage optical transformer and a high voltage driven device, where the high voltage optical transformer is located in close proximity to the high voltage driven device. A high voltage connection between the high voltage optical transformer and the high voltage driven device may be shorter than a low voltage connection between the high voltage optical transformer and a low voltage power source used to control the transformer.

20 Claims, 12 Drawing Sheets

(51) Int. Cl.
*G21K 5/00* (2006.01)
*H01L 23/00* (2006.01)
*H01L 23/31* (2006.01)
*H01L 31/12* (2006.01)
*H02N 2/04* (2006.01)

(52) U.S. Cl.
CPC ............ *H01L 23/562* (2013.01); *H01L 31/12* (2013.01); *G02B 3/12* (2013.01); *H02N 2/04* (2013.01)

(58) Field of Classification Search
CPC ..... H01L 31/12; H01L 31/042; H01L 31/167; H01L 31/03926; G02B 3/12; G02B 27/017; H02N 2/04; Y02E 10/50
See application file for complete search history.

(56) References Cited

U.S. PATENT DOCUMENTS

| | | | | |
|---|---|---|---|---|
| 5,097,252 | A * | 3/1992 | Harvill | G06F 3/0338 340/540 |
| 5,248,931 | A | 9/1993 | Flesner et al. | |
| 6,265,653 | B1 | 7/2001 | Haigh et al. | |
| 6,359,210 | B2 | 3/2002 | Ho et al. | |
| 7,701,642 | B2 * | 4/2010 | Obinata | G02B 3/0056 359/665 |
| 2013/0119409 | A1 | 5/2013 | Zhao | |
| 2014/0061679 | A1 | 3/2014 | Guo | |

OTHER PUBLICATIONS

Bumiller et al., "A Review of Models for Time-to-Failure Due to Metallic Migration Mechanisms", DFR Solutions, as accessed on Aug. 7, 2020, 14 pages.

"Photomultiplier Tube Modules", Hamamatus Photonics K.K., Mar. 2019, 44 pages.

Asad, Mohsen, "GaN-based micro-LED integration with thin-film transistor devices for flexible displays", University of Waterloo, Electrical and Computer Engineering, PhD Seminar, Mar. 11, 2019, 2 pages.

"Disruptive Innovations in Solar Energy and Energy Efficiency Thing and Flexible LED Lighting Panels", Lucent Optics, Inc., as accessed on Dec. 16, 2020, 1 page.

Moon et al., "Highly efficient single-junction GaAs thin-film solar cell on flexible substrate", URL: www.nature.com/scientificreports, vol. 6, Article, 30107, Jul. 20, 2016, pp. 1-6.

Silvestre et al., "Study of bypass diodes configuration on PV modules", Science Direct, Applied Energy, vol. 86, Issue 9, 2009, pp. 1632-1640.

International Search Report and Written Opinion for International Application No. PCT/US2021/049072, mailed Dec. 3, 2021, 11 pages.

International Preliminary Report on Patentability for International Application No. PCT/US2021/049072, mailed Apr. 13, 2023, 9 pages.

* cited by examiner

HIGH VOLTAGE OPTICAL TRANSFORMER INTEGRATION

CROSS-REFERENCE TO RELATED APPLICATION

This application claims the benefit of priority under 35 U.S.C. § 119(e) of U.S. Provisional Application No. 63/084,592, filed Sep. 29, 2020, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
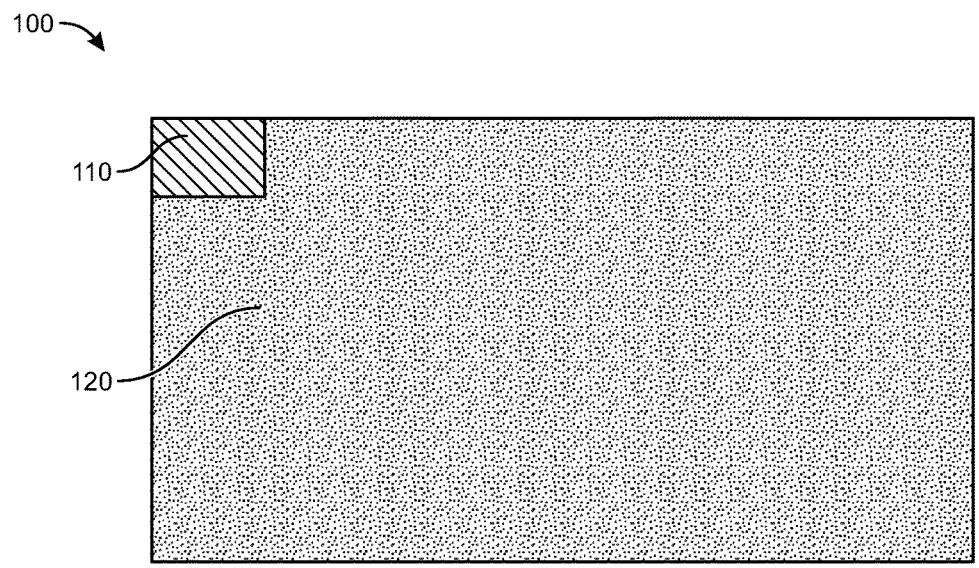
FIG. 1 is a schematic illustration of a high voltage optical transformer (HVOT) directly mounted to a high voltage driven device (HVDD) according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

High voltages may be used to power a variety of different devices and systems, including high voltage relays, cathode ray tubes, e.g., to generate x-rays and particle beams, piezoelectric actuators, e.g., to manipulate the focal length of variable focal length lenses, and haptic devices. In this regard, a voltage transformer may be used to provide and/or increase voltage output where the generated voltage of a device or system is otherwise insufficient. Many voltage transformers, including step-up converters (booster converters) and piezo-transformers, for example, may be configured to convert relatively low DC input voltages (~1V-2V) to output voltages greater than 1 kV. However, the design of many such voltage transformers, including the requisite inductors and capacitors, may unduly increase the weight and/or size of the device (e.g., to 1 cm$^3$ and greater), which may be excessive for many applications, including wearable devices. Thus, notwithstanding recent developments, it would be advantageous to provide an economical high voltage source having a compact footprint.

In some embodiments, in addition to the foregoing, compact integration may include locating the power supply in an area of a device that may be subjected to bending. Particularly in the case of high voltage actuators such as piezoelectric and electrostatic actuators, it may be operationally beneficial to locate the high voltage power supply in close proximity to the actuator itself. According to some embodiments, a high voltage power supply positioned proximate to or in "close proximity" to a high voltage driven device may be located on the HVDD (e.g., mounted directly to the HVDD) or at a distance less than a linear dimension of the high voltage power supply itself.

The present disclosure is generally related to high voltage optical transformers, and more specifically to the compact integration of rigid or flexible high voltage sources proximate to high voltage driven devices. The disclosed system architectures, which may include co-location of a high voltage optical transformer and an associated high voltage driven device, may enable the elimination of long, high voltage cables ubiquitous to conventional high voltage sources and the attendant realization of size- and weight-sensitive devices that are safer, better performing, more reliable, and more economical than their traditional counterparts. As disclosed herein, a "high voltage" optical transformer may in some examples be configured to generate a voltage output of at least approximately 100V.

In certain embodiments, micrometer-scale photovoltaic cells may be arrayed to form an optical transformer having commercially-relevant dimensions. For example, in combination with a light source powered by a DC voltage source, an optical transformer (DC to DC converter) may exhibit a footprint of less than approximately 1 mm$^3$. Example optical transformers may be configured to provide scalable output, i.e., open-circuit voltages from approximately 100V to greater than approximately 1 kV, e.g., 100, 200, 500, or 1000 V or more, including ranges between any of the foregoing values.

In certain embodiments, an optical transformer may include a light source and an array of photovoltaic cells optically coupled to the light source. By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters in an addressable array.

By way of example, a light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators.

According to certain embodiments, the optical power generation of the light source and hence the output voltage of the optical transformer may be controlled by voltage or current modulation. Such modulation may be analog (e.g., current amplitude modulation) or digital (e.g., pulse width modulation). A PID control circuit may be used to control the modulation and stabilize the output voltage.

The light source may be configured to illuminate one or more photovoltaic cells, e.g., within a photovoltaic cell array. Example photovoltaic cells may include one or more p-n junctions (or p-i-n—junctions) within a semiconductor to obtain a current from photons absorbed near the junction(s). Photovoltaic materials within the photovoltaic cells may include bulk layers, quantum wells, quantum wires, or quantum dots, although further structures are contemplated. As a direct bandgap material, gallium arsenide (GaAs) is highly absorbing to photons having an energy greater than its bandgap ($E_g$). Further example direct bandgap semiconductors include InP, InGaAs, AlGaAs, InGaN, InGaP, InGaAsP, InGaAsPN, AlGaN, GaN, GaP, GaAsP, AlGaInP, and the like. In alternate embodiments, the photovoltaic cells may be manufactured from an indirect bandgap semiconductor such as silicon (Si) or germanium (Ge). For instance, an example monolithic integrated micro photovoltaic cell array may include silicon, where the p-n junctions (or p-i-n junctions) may be formed by lateral doping profiles.

In some embodiments, the light source and the photovoltaic cell array may be in direct contact. In some embodiments, an optical connector may be disposed between the light source and the photovoltaic cell array to guide emitted light from the light source to the photovoltaic cells within the array. An optical connector may include any material suitable for guiding light, including glass, polymer, and/or semiconductor compositions. The optical connector may include crystalline or amorphous materials, for example. In some embodiments, the optical connector may include a gas or a liquid. The optical connector may be electrically insulating. To inhibit reflective losses, in certain embodiments, the optical connector may be characterized by a refractive index of at least approximately 1.5.

In some embodiments, the light source may include N emitters and the photovoltaic cell array may include N corresponding photovoltaic cells. In further embodiments, the number of emitters may exceed the number of photovoltaic cells. In still further embodiments, the number of photovoltaic cells may exceed the number of emitters. The optical connector may further include a micro lens array or other element(s) configured to focus emitted light onto individual photovoltaic cells, e.g., onto the center of respective photovoltaic cells.

In example HVOTs, a low voltage circuit that controls the light source(s) may be fully decoupled from the high voltage output circuit. Thus, the low voltage circuit may provide a ground loop that is isolated from the high voltage output.

In accordance with various embodiments, in the presently-disclosed high voltage optical transformers, high voltage cables leading from the transformer to an associated high voltage driven device may be substantially shortened or even eliminated such that the high voltage cables may be shorter than low voltage cables used to connect the transformers to respective control circuits. Shorter high voltage cables may present a number of advantages, including a decreased tendency to receive environmental noise and a decreased tendency to broadcast radiation that might interfere with nearby radiation-sensitive devices. In some embodiments, a high voltage output may be directed to one or more components, and any associated switching may be performed on the low voltage side of the device.

As will be appreciated, high voltage optical transformers may generate smaller magnetic fields than comparative inductive high voltage sources and thus may require substantially less shielding, which may beneficially impact the total weight and thickness of the transformer.

Furthermore, in the context of thermal efficiency, the integration of dedicated HVOTs with each HVDD may more evenly distribute heat sources throughout the system, thus decreasing the need for large heat dissipation channels. In certain embodiments, heat produced by the HVOTs may be transported away using, for example, microfluidic cooling, metallic fibers, liquid metals, heat pipes, and the like. In some embodiments, heat may be directed to nearby devices whose performance may benefit from a higher operational temperature. For example, in a liquid lens, higher temperatures may decrease the viscosity of the enclosed lens fluid, which may increase the response time of the lens.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-17, detailed descriptions of optical transformers, i.e., optically-driven voltage converters, as well as devices and systems using such optical transformers. The discussion associated with FIGS. 1-10 relates to photovoltaic (PV) system architectures having high voltage optical transformers located proximate to a high voltage driven device. The discussion associated with FIGS. 11-17 relates to exemplary haptic, virtual reality and augmented reality devices that may include a locally-situated high voltage optical transformer as disclosed herein.

Figure 2:
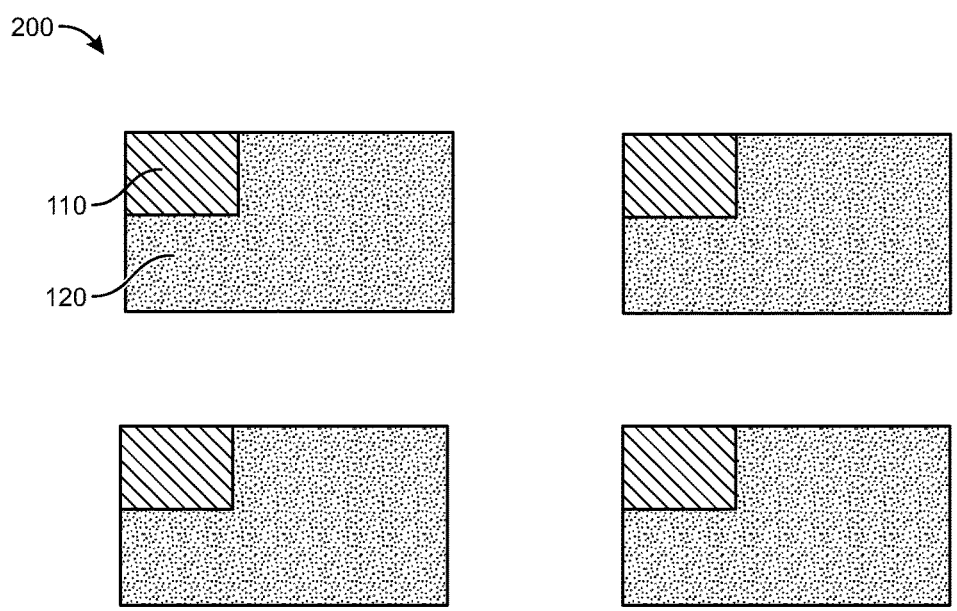
FIG. 2 is a schematic illustration showing an array of high voltage driven devices each connected to a respective high voltage optical transformer according to some embodiments.

Referring to FIG. 1, a system 100 may include a high voltage optical transformer 110 mounted directly to a high voltage driven device 120. The co-location of the HVOT 110 and the high voltage driven device 120 may decrease the overall footprint of system 100. Referring to FIG. 2, a further example system 200 may include multiple HVOTs 110 each mounted directly on a respective HVDD 120. In contrast to using a single HVOT to power multiple devices, a system 200 having dedicated, direct-mount HVOTs 110 may allow each transformer 110 to be individually configured for each respective HVDD 120, e.g., in terms of power, size, weight considerations, etc., while obviating the need for large, high voltage switches. Powering each device 120 separately may also increase the redundancy of the power network, i.e., decreasing the number of affected devices 120 in the event of failure of a single HVOT or a subset of HVOTs 110.

Figure 3:
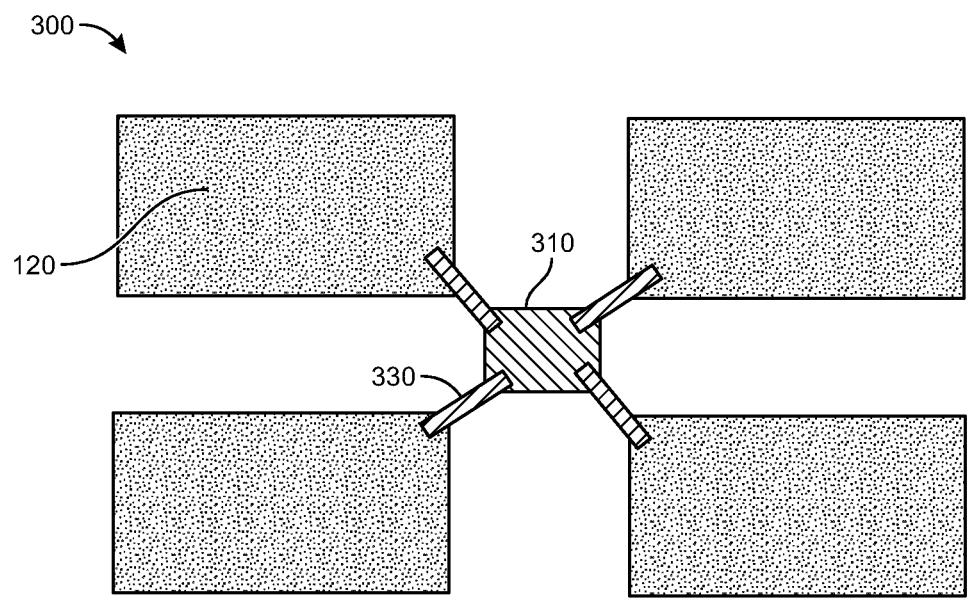
FIG. 3 is a schematic illustration of a system having multiple high voltage driven devices (HVDDs) collectively powered by a single high voltage optical transformer (HVOT) according to certain embodiments.
Figure 4:
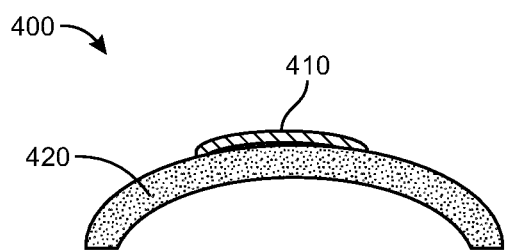
FIG. 4 is a schematic illustration showing a flexible high voltage optical transformer mounted directly over a curved surface of a high voltage driven device according to various embodiments.

Referring to FIG. 3, according to further embodiments, a system 300 may include a single HVOT 310 located in close proximity to one or more HVDDs 120. High voltage connections 330 may be used to connect the HVOT 310 to each respective high voltage driven device 120.

In some embodiments, a system may include a deformable, i.e., flexible, high voltage optical transformer. By way of example, referring to the cross-sectional view of FIG. 4, system 400 may include a flexible high voltage optical transformer 410 mounted directly on a curved (i.e., non-planar) surface of a high voltage driven device 420.

Figure 5:
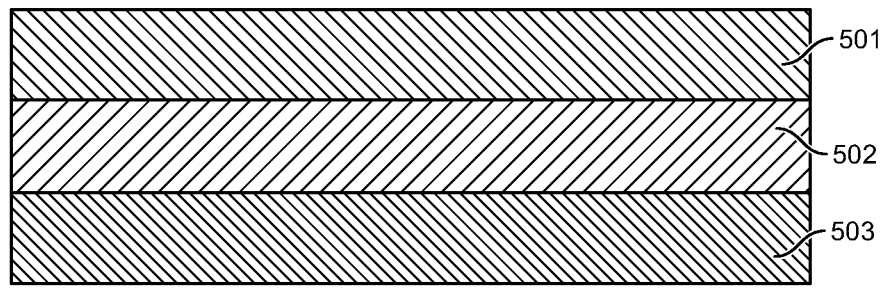
FIG. 5 is a cross-sectional view of a multilayer high voltage optical transformer according to some embodiments.

An example high voltage optical transformer is shown schematically in FIG. 5. Optical transformer 510 may include, from top to bottom, a light emitting layer 501, an optical coupling layer 502, and a photovoltaic layer 503. Light emitting layer 501 may include any suitable light source, including one or more LEDs, micro-LEDs, OLEDs, micro-OLEDs, VCSELs, and the like. Light emitting layer 501 may be optically connected to photovoltaic layer 503 via optical coupling layer 502, which may be configured to transmit light from the light emitting layer 501 to the photovoltaic layer 503 as well as provide electrical insulation therebetween.

Figure 6:
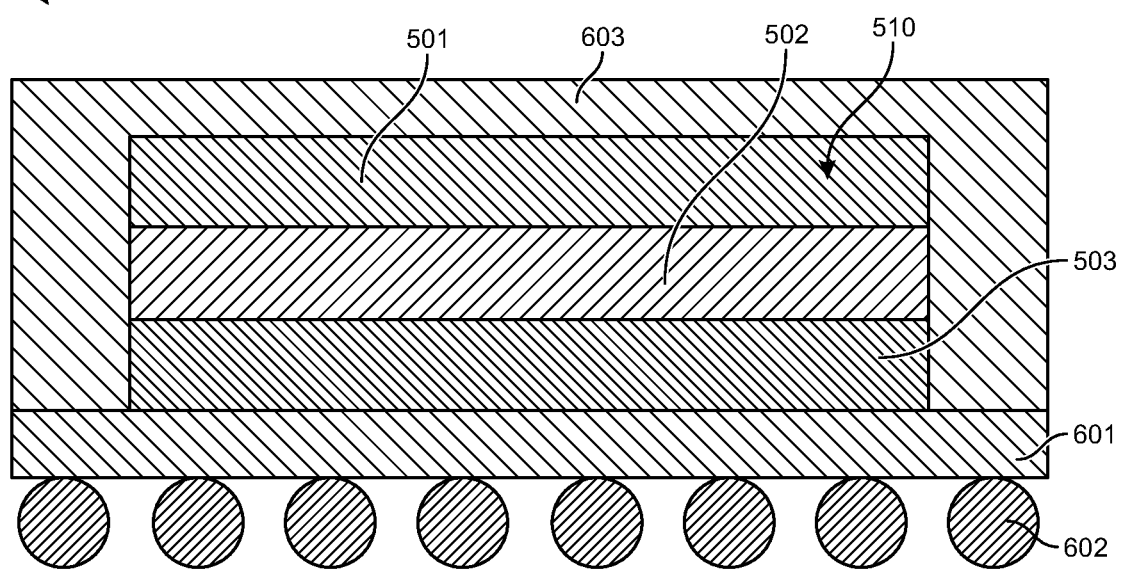
FIG. 6 is a cross-sectional view of a chip-scale package (CSP) including the multilayer high voltage optical transformer of FIG. 5 according to some embodiments.

A cross-sectional view of an example chip-scale package (CSP) including optical transformer 510 is illustrated schematically in FIG. 6. In chip-scale package 600, optical transformer 510 may be located over an interposer layer 601, which may provide electrical connections to a solder ball array 602. The optical transformer 510, including light emitting layer 501, optical coupling layer 502, and photovoltaic layer 503, may be encapsulated within a packaging layer 603. Packaging layer 603 may include a suitable plastic or polymer material and may be configured to protect the optical transformer 510 from moisture, debris, etc. In some embodiments, a packaging layer may partially or wholly encapsulate an optical transformer or a CSP. A packaging layer may include silicone, for example. As illustrated in further detail herein, individual solder balls within the solder ball array 602 may be soldered to a printed circuit board (PCB) or a flexible printed circuit (FPC).

According to certain embodiments, the respective dimensions (e.g., length, width, and thickness) of a chip-scale package (CSP) may independently range from approximately 1 mm to approximately 10 mm, e.g., 1, 2, 3, 4, 5, 6, 7, 8, 9 or 10 mm, including ranges between any of the foregoing values. Thus, example CSPs may have dimensions of $2\times2\times1$ mm$^3$, $4\times4\times4$ mm$^3$, $10\times10\times5$ mm$^3$, etc.

Figure 7:
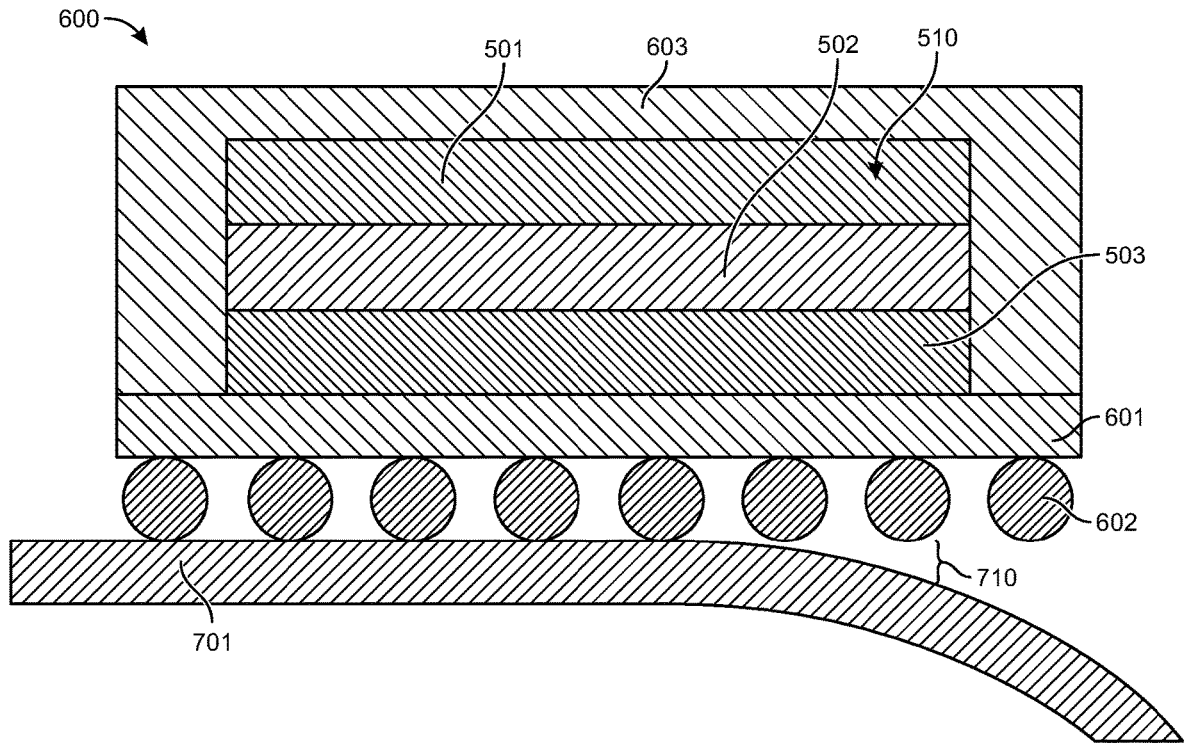
FIG. 7 is a schematic cross-sectional view illustrating failure of the electrical connection between the CSP of FIG. 6 and a flexible printed circuit (FPC) in response to bending of the flexible printed circuit according to certain embodiments.

During use, deformation (i.e., bending) of a printed circuit board (PCB) or a flexible printed circuit (FPC) may challenge the mechanical integrity of a chip-scale package (CSP) bonded thereto and/or the mechanical integrity of the bond. Referring to FIG. 7, one example mode of failure may include delamination of one or more solder balls from the solder ball array 602 from flexible printed circuit 701 resulting in a gap 710 and an attendant break in electrical continuity between the CSP 600 and the FPC 701. Although not illustrated, according to further examples, the solder balls may remain attached to the flexible printed circuit 701 but may undesirably separate from the interposer layer 601. A still further failure mechanism may include fracture of the solder balls themselves.

Figure 8:
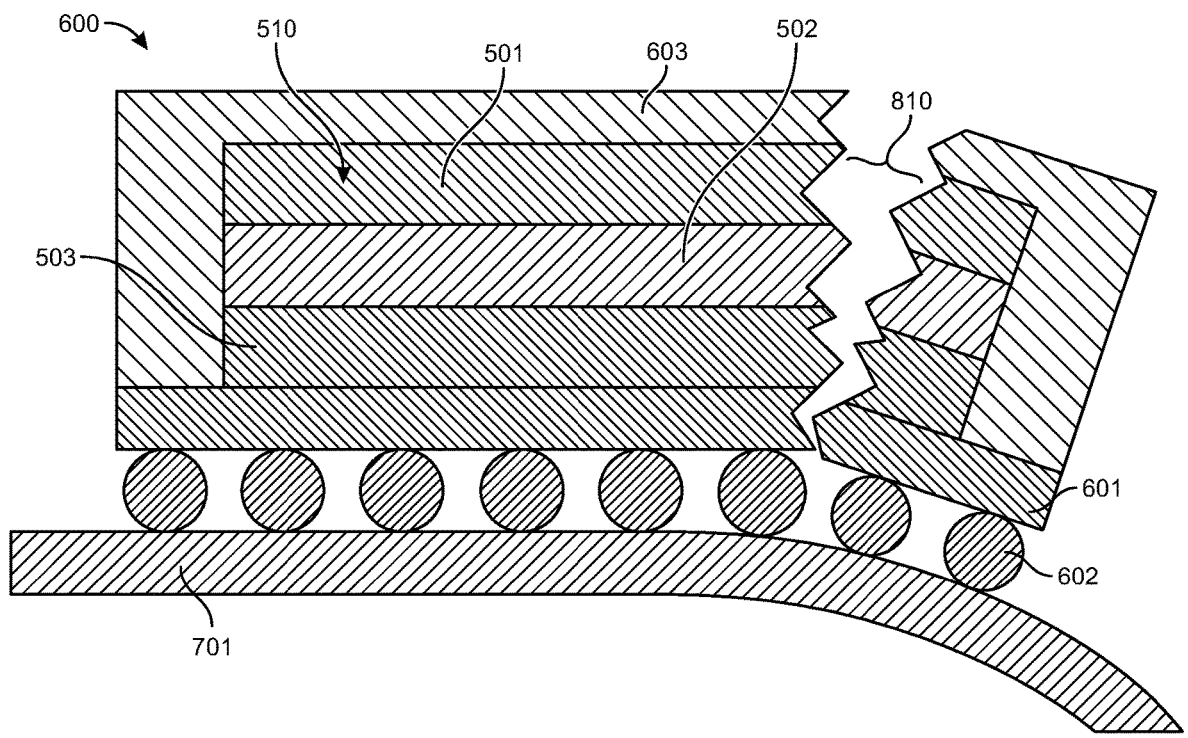
FIG. 8 is a schematic cross-sectional view illustrating direct failure of the CSP of FIG. 6 in response to bending of a flexible printed circuit according to certain embodiments.

According to further examples, and with reference to FIG. 8, excessive strain may result in fracture of the chip-scale package 600 resulting in an intra-package crack 810 notwithstanding survivability of the solder ball contacts. Such a result may accompany the application of excessive stress to a rigid or insufficiently flexible high voltage optical transformer 510 and produce a device failure.

Figure 9:
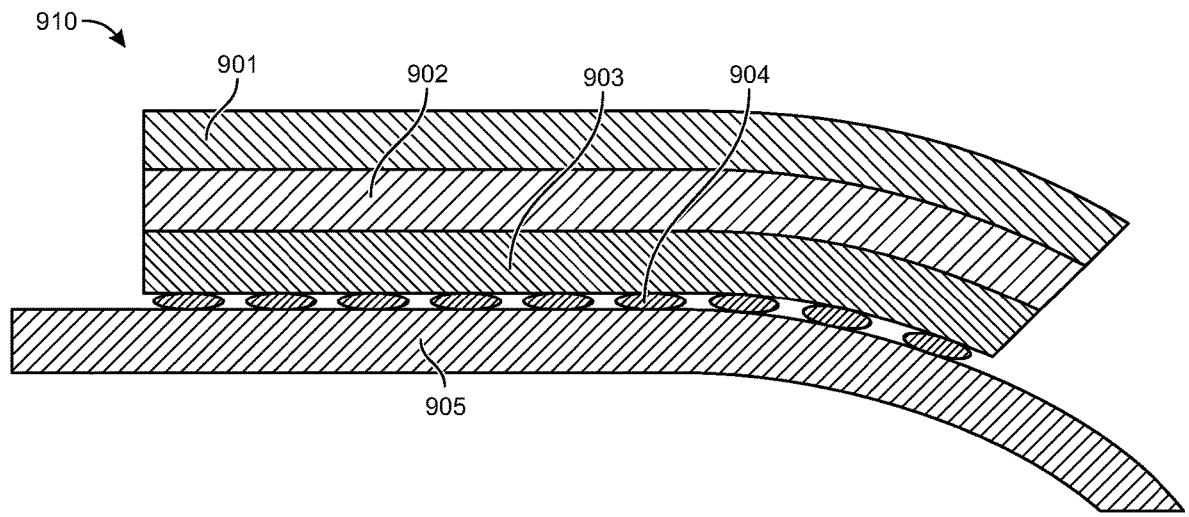
FIG. 9 is a cross-sectional schematic view of a flexible thin film high voltage optical transformer according to some embodiments.

In some embodiments, in lieu of using rigid layers to form an HVOT, a thin film high voltage optical transformer may exhibit sufficient flexibility to withstand typical strains encountered during use and thus avoid mechanical failure. An example flexible high voltage optical transformer is shown in FIG. 9. Flexible high voltage optical transformer 910 may include, from top to bottom, a flexible thin film light emitting layer 901, a flexible thin optical coupling layer 902, and a flexible thin film photovoltaic layer 903. A solder ball array 904 may provide electrical contact with flexible printed circuit 905.

Figure 10:
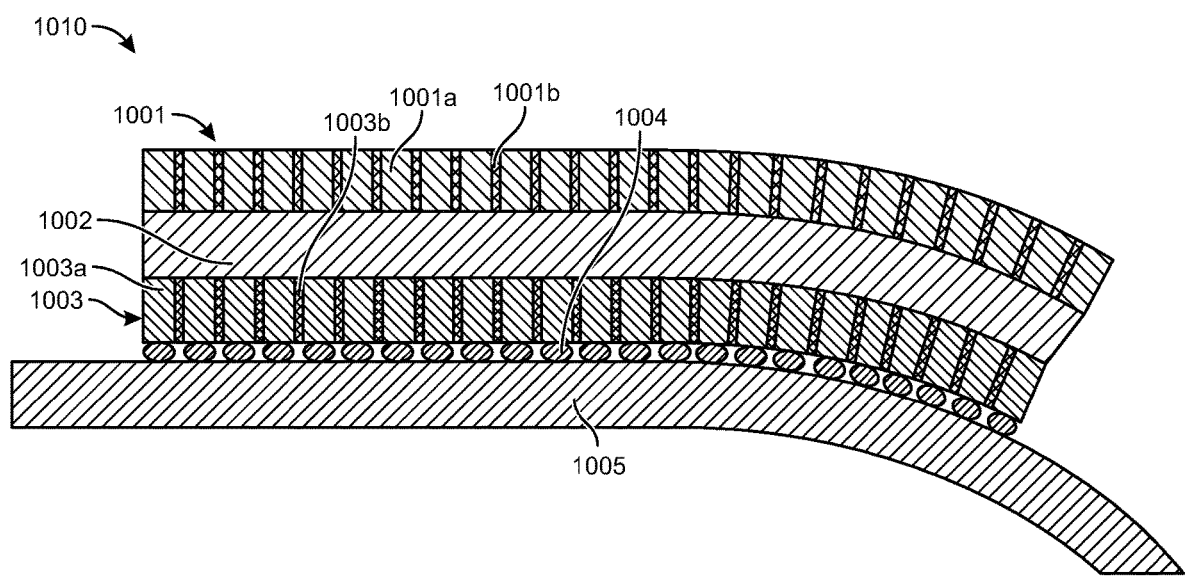
FIG. 10 is a cross-sectional schematic view of a partially flexible segmented high voltage optical transformer according to some embodiments.

According to further embodiments, referring to FIG. 10, shown is an example architecture of a partially flexible HVOT. Partially flexible HVOT 1010 may include, from top to bottom, a segmented light emitting layer 1001, an optical coupling layer 1002, and a segmented photovoltaic layer 1003. The optical coupling layer 1002 may include a flexible layer. Segmented light emitting layer 1001 may be partially flexible and may include alternating flexible and rigid portions 1001a, 1001b, respectively. Segmented light emitting layer 1001 may be formed on, or transferred to, a flexible substrate. In a related vein, segmented and partially-flexible photovoltaic layer 1003 may include alternating flexible and rigid portions 1003a, 1003b, respectively. In some embodiments, flexible portions 1003a may include active photovoltaic cells (not shown) while rigid portions 1003b may include an inactive spacer material. A solder ball array 1004 may provide electrical contact between the segmented photovoltaic layer 1003 (e.g., flexible portions 1003a) and a flexible printed circuit 1005.

High voltage optical transformers (e.g., HVOTs 510, 910, 1010) may be integrated into a wide-range of systems and devices, such as where a compact and light-weight form factor are desired. Example applications include user-wearable systems such as liquid lenses and haptic devices, sensors, medical devices such as implantable devices, and communications systems such as drones and satellites.

Figure 11:
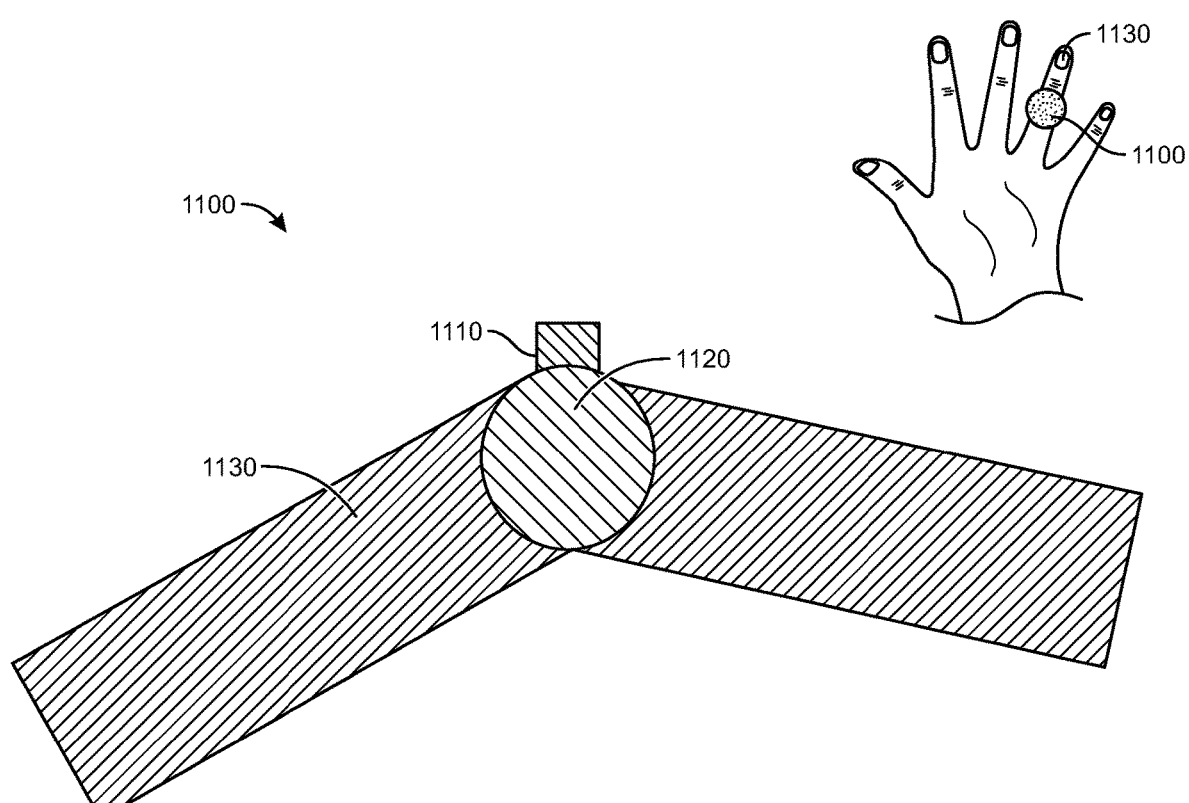
FIG. 11 illustrates the integration of a high voltage optical transformer with an electrostatic clutch according to some embodiments.

A liquid lens, for instance, may be driven by bimorph or electrostatic actuators where the HVOT is incorporated into the lens architecture in close proximity to the actuators, i.e., as part of the wearable system. In further examples, haptic devices may include vibrotactile haptic actuators, such as a dielectric elastomer actuator or an electrostatic clutch. Referring to FIG. 11, for instance, a haptic actuator 1100 may include an HVOT 1110 configured to power an electrostatic chuck 1120 located proximate to a digit 1130 of a user. As shown in the illustrated embodiment, the HVOT 1110 may be mounted directly to the electrostatic chuck 1120.

Figure 12:
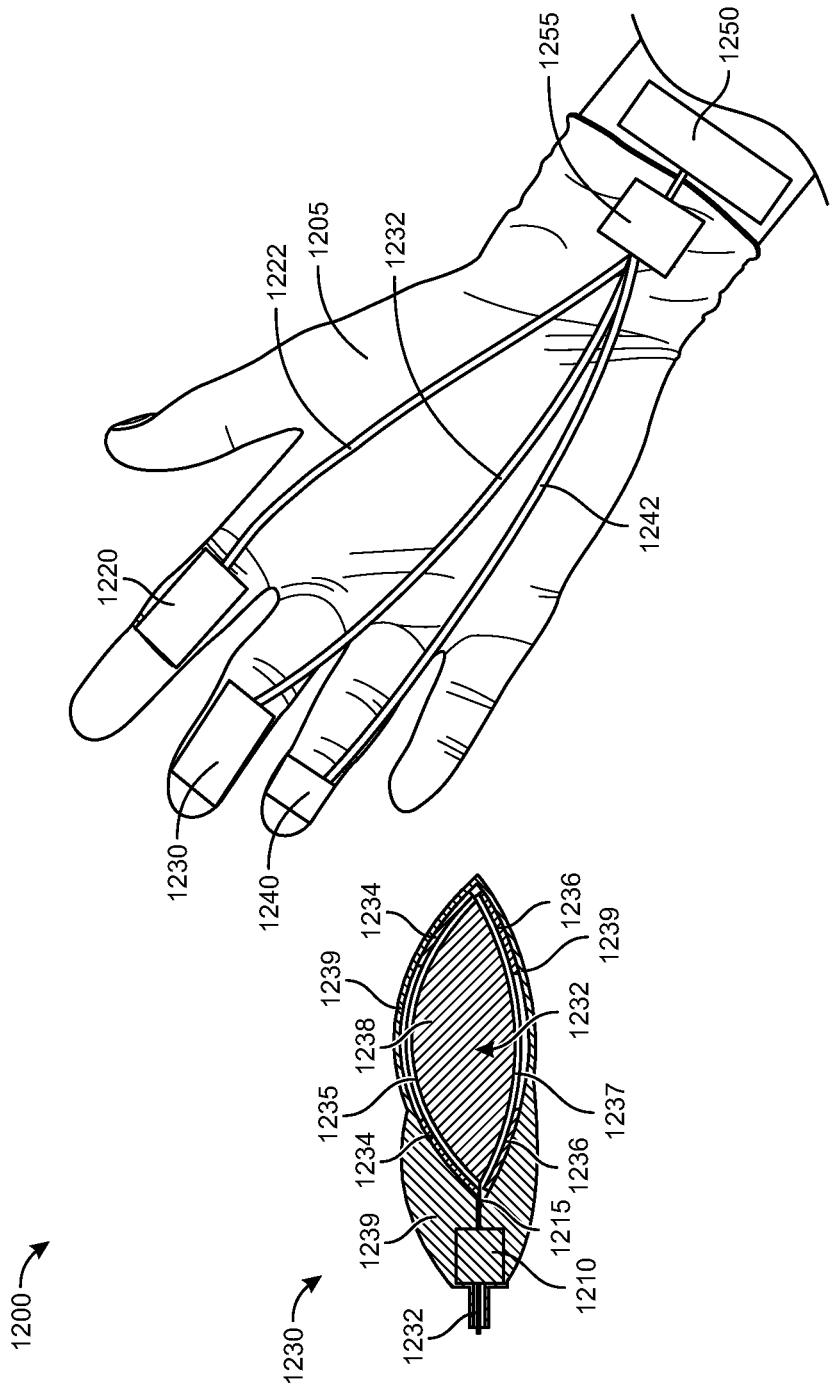
FIG. 12 illustrates the integration of a high voltage optical transformer with one or more high voltage driven haptic devices according to certain embodiments.

Referring to FIG. 12, a wearable system 1200 may include a glove 1205 or other wearable article fitted with one or more high voltage devices, such as a kinesthetic impedance (KI) display 1220, a tactile actuator 1230, and a shear actuator 1240. Each device 1220, 1230, 1240 may be integrated with a respective high voltage optical transformer (not separately shown), which may be connected using low voltage cables 1222, 1232, 1242 to a low voltage source 1250 such as a battery or a solar panel via switching element 1255. Thus, each HVOT in wearable system 1200 may have a low voltage input and a high voltage output.

By way of example, tactile actuator 1230 may include a high voltage optical transformer 1210 mounted in close proximity to actuator body 1232. In the illustrated embodiment, actuator body 1232 may include a primary electrode 1234, a secondary electrode 1236 overlapping at least a portion of the primary electrode 1234, and a pair of opposing membranes 1235, 1237 disposed between the electrodes and configured to enclose a body of dielectric fluid 1238. In certain embodiments, membrane 1235 may be a deformable membrane and membrane 1237 may be a rigid (substantially non-deformable) membrane.

High voltage optical transformer 1210 may be disposed adjacent to actuator body 1232 and electrically connected to one or more of the primary electrode 1234 and the secondary electrode 1236 via a high voltage cable 1215. In the illustrated embodiment, a length of the high voltage cable 1215 may be less than a length of the low voltage cable 1232 connecting the tactile actuator 1230 with low voltage source 1250. An insulation layer 1239 may be used to encapsulate tactile actuator 1230 including the high voltage cable 1215 and the low voltage cable 1232.

High voltage optical transformers may also be used to provide power to sensing systems. By way of example, photomultipliers are capable of detecting single photons and have a large range of applications, including chemical and biological sensing, quantum computing, and the monitoring of neuronal activity. Photomultiplier modules themselves may exhibit a commercially-relevant form factor; however, with typical operational voltages in excess of approximately 1 kV, the limited availability of compact, high voltage power supplies has limited their use in many applications.

A number of medical applications may benefit from a compact, high voltage source. Implantable defibrillators, for instance, are currently relatively large devices that use traditional methods and structures to generate high voltages. Such approaches often require the use of heavy components, such as inductors and transformers. HVOTs, on the other hand, may present both a size benefit and a weight benefit to such an application. In some embodiments, a high voltage optical transformer may be mounted in close proximity to the defibrillator, potentially inside the body, decreasing the length of high voltage cables.

With a low voltage input electrically isolated from the high voltage output, the input and output terminals of exemplary HVOTs may not share a common ground, which may significantly decrease the likelihood of electric shock during use. In addition, the output may be characterized by a high impedance. Accordingly, the current between the two output terminals is typically low and insufficient to harm a user. In a similar vein, the HVOTs disclosed herein may be characterized by a relatively low device capacitance, which limits the total charge stored by the transformers. Rather, in accordance with various embodiments, power may be produced on demand through illumination of the PV cells. Finally, in some embodiments, the maximum available electric power of an HVOT may be limited due to self-heating of the device. That is, in the event of a control circuit failure, rapid thermal overloading will restrict the maximum output power.

As a further example, high voltage optical transformers may also be used in miniaturized satellites, such as a nano, femto, or pico satellites, where size and weight are often signification parameters.

A system includes one or more high voltage driven devices (HVDDs) and a high voltage optical transformer (HVOT) located proximate to the device(s). Such compact integration may decrease the need for long high voltage cables, which may beneficially impact the system footprint (<5 mm$^3$), including its weight by also eliminating the need for HV connection hardware. In addition, tighter integration may decrease the propensity for unwanted generation of radiative emission and magnetic fields, as well as improve operational bandwidth. In certain embodiments, the high voltage optical transformer may be flexible and may be mounted directly on one or more of the devices. A "flexible" component, structure, or element (e.g., a flexible high voltage optical transformer) may, in certain embodiments, exhibit a large strain-to-failure, and may accommodate strains of at least approximately 5%, e.g., at least approximately 10%, at least approximately 15%, at least approximately 20%, at least approximately 50%, or at least approximately 100%, including ranges between any of the foregoing values.

A flexible HVOT architecture may be incorporated into wearable systems. The HVOT may be thermally isolated from the HVDDs using, for example, an isolation layer disposed therebetween. A flexible HVOT may include a flexible light source and a thin film array of photovoltaic cells optically coupled to the light source. The flexible light source may include an LED, a micro-LED, an OLED, or a VCSEL, for example. In some embodiments, the flexible light source may include an edge-emitting or a surface-emitting device coupled to a flexible light guide.

EXAMPLE EMBODIMENTS

Example 1: A system includes a high voltage optical transformer, and a high voltage driven device, where the high voltage optical transformer is located in close proximity to the high voltage driven device.

Example 2: The system of Example 1, where the high voltage optical transformer includes a light source optically coupled to a photovoltaic cell.

Example 3: The system of Example 2, where the light source includes a surface-emitting device or an edge-emitting device.

Example 4: The system of any of Examples 1-3, where the high voltage optical transformer is mounted directly over the high voltage driven device.

Example 5: The system of any of Examples 1-4, further including a flexible layer between the high voltage optical transformer and the high voltage driven device.

Example 6: The system of any of Examples 1-5, further including a thermally-insulating layer between the high voltage optical transformer and the high voltage driven device.

Example 7: The system of any of Examples 1-6, where the high voltage optical transformer is flexible.

Example 8: The system of any of Examples 1-7, where the high voltage optical transformer is mounted directly over a curved surface of the high voltage driven device.

Example 9: The system of any of Examples 1-8, further including a high voltage connection electrically coupling the high voltage optical transformer to the high voltage driven device, a low voltage source configured to control the high voltage optical transformer, and a low voltage connection electrically coupling the low voltage source to the high voltage optical transformer.

Example 10: The system of Example 9, where the low voltage source is electrically isolated from the high voltage connection.

Example 11: The system of any of Examples 9 and 10, where a length of the high voltage connection is less than a length of the low voltage connection.

Example 12: The system of any of Examples 1-11, where the high voltage driven device includes a liquid lens.

Example 13: The system of any of Examples 1-12, including a plurality of high voltage optical transformers and a plurality of high voltage driven devices, where each high voltage driven device is directly mounted to a respective high voltage optical transformer.

Example 14: A head-mounted display including the system of any of Examples 1-13.

Example 15: A system includes a plurality of high voltage driven devices, each high voltage driven device having a corresponding high voltage optical transformer mounted directly thereto.

Example 16: The system of Example 15, where at least one of the high voltage optical transformers is flexible.

Example 17: The system of any of Examples 15 and 16, further including a high voltage connection electrically coupling each high voltage optical transformer to each respective high voltage driven device, a low voltage source configured to control each high voltage optical transformer, and a low voltage connection electrically coupling the low voltage source to each high voltage optical transformer.

Example 18: The system of Example 17, where the low voltage source is electrically isolated from the high voltage connection.

Example 19: A method includes forming a high voltage optical transformer directly over a high voltage driven device.

Example 20: The method of Example 19, where the high voltage optical transformer is formed directly over a non-planar surface of the high voltage driven device.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1300 in FIG. 13) or that visually immerses a user in an artificial reality (e.g., virtual-reality system 1400 in FIG. 14). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 13:
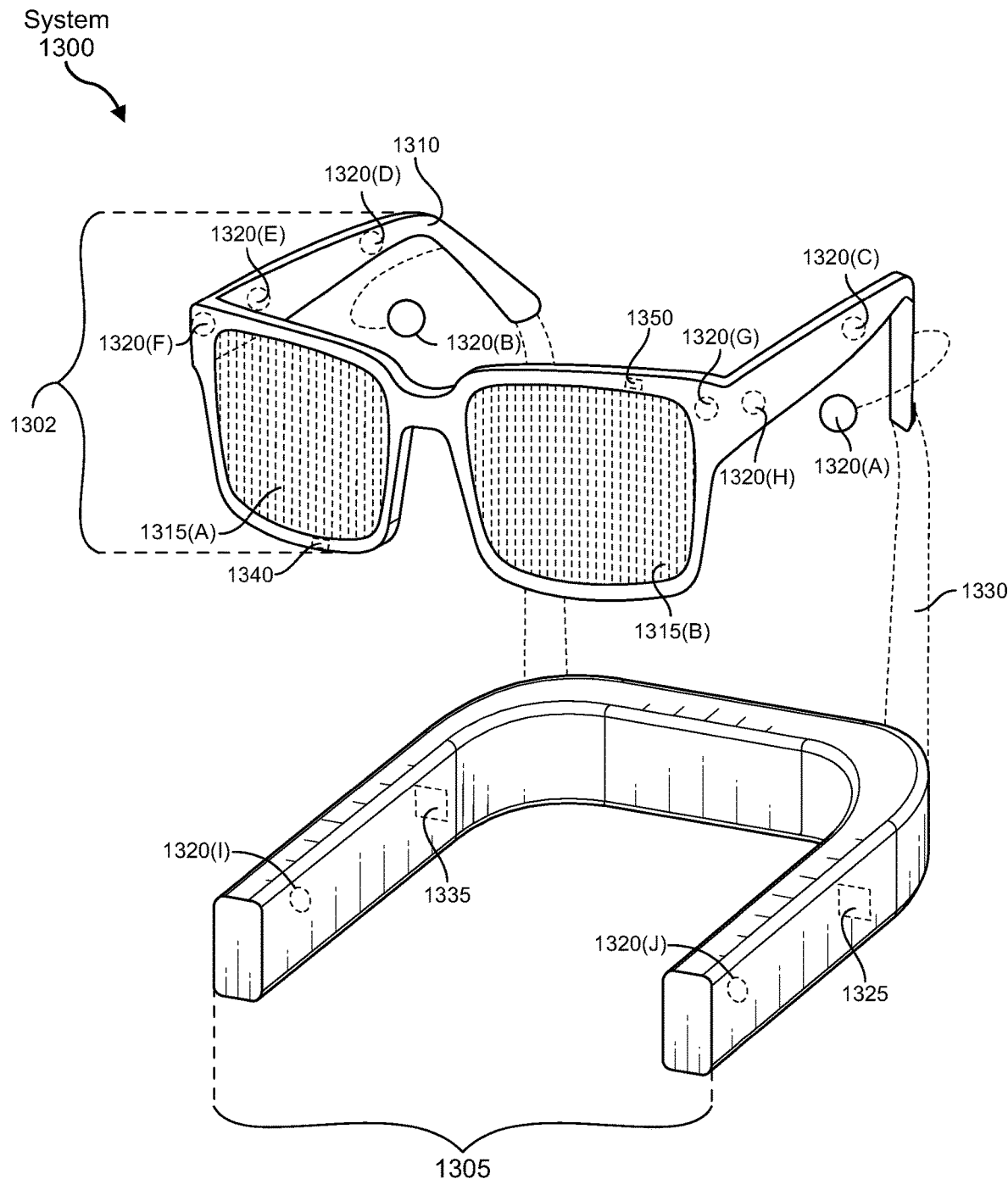
FIG. 13 is an illustration of exemplary augmented-reality glasses that may be used in connection with embodiments of this disclosure.

Turning to FIG. 13, augmented-reality system 1300 may include an eyewear device 1302 with a frame 1310 configured to hold a left display device 1315(A) and a right display device 1315(B) in front of a user's eyes. Display devices 1315(A) and 1315(B) may act together or independently to present an image or series of images to a user. While augmented-reality system 1300 includes two displays, embodiments of this disclosure may be implemented in augmented-reality systems with a single NED or more than two NEDs.

In some embodiments, augmented-reality system 1300 may include one or more sensors, such as sensor 1340. Sensor 1340 may generate measurement signals in response to motion of augmented-reality system 1300 and may be located on substantially any portion of frame 1310. Sensor 1340 may represent a position sensor, an inertial measurement unit (IMU), a depth camera assembly, a structured light emitter and/or detector, or any combination thereof. In some embodiments, augmented-reality system 1300 may or may not include sensor 1340 or may include more than one sensor. In embodiments in which sensor 1340 includes an IMU, the IMU may generate calibration data based on measurement signals from sensor 1340. Examples of sensor 1340 may include, without limitation, accelerometers, gyroscopes, magnetometers, other suitable types of sensors that detect motion, sensors used for error correction of the IMU, or some combination thereof. Augmented-reality system 1300 may also include a microphone array with a plurality of acoustic transducers 1320(A)-1320(J), referred to collectively as acoustic transducers 1320. Acoustic transducers 1320 may be transducers that detect air pressure variations induced by sound waves. Each acoustic transducer 1320 may be configured to detect sound and convert the detected sound into an electronic format (e.g., an analog or digital format). The microphone array in FIG. 13 may include, for example, ten acoustic transducers: 1320(A) and 1320(B), which may be designed to be placed inside a corresponding ear of the user, acoustic transducers 1320(C), 1320(D), 1320(E), 1320(F), 1320(G), and 1320(H), which may be positioned at various locations on frame 1310, and/or acoustic transducers 1320(1) and 1320(J), which may be positioned on a corresponding neckband 1305.

In some embodiments, one or more of acoustic transducers 1320(A)-(F) may be used as output transducers (e.g., speakers). For example, acoustic transducers 1320(A) and/or 1320(B) may be earbuds or any other suitable type of headphone or speaker.

The configuration of acoustic transducers 1320 of the microphone array may vary. While augmented-reality system 1300 is shown in FIG. 13 as having ten acoustic transducers 1320, the number of acoustic transducers 1320 may be greater or less than ten. In some embodiments, using higher numbers of acoustic transducers 1320 may increase the amount of audio information collected and/or the sensitivity and accuracy of the audio information. In contrast, using a lower number of acoustic transducers 1320 may decrease the computing power required by an associated controller 1350 to process the collected audio information. In addition, the position of each acoustic transducer 1320 of the microphone array may vary. For example, the position of an acoustic transducer 1320 may include a defined position on the user, a defined coordinate on frame 1310, an orientation associated with each acoustic transducer 1320, or some combination thereof.

Acoustic transducers 1320(A) and 1320(B) may be positioned on different parts of the user's ear, such as behind the pinna, behind the tragus, and/or within the auricle or fossa. Or, there may be additional acoustic transducers 1320 on or surrounding the ear in addition to acoustic transducers 1320 inside the ear canal. Having an acoustic transducer 1320 positioned next to an ear canal of a user may enable the microphone array to collect information on how sounds arrive at the ear canal. By positioning at least two of acoustic transducers 1320 on either side of a user's head (e.g., as binaural microphones), augmented-reality device 1300 may simulate binaural hearing and capture a 3D stereo sound field around about a user's head. In some embodiments, acoustic transducers 1320(A) and 1320(B) may be connected to augmented-reality system 1300 via a wired connection 1330, and in other embodiments acoustic transducers 1320(A) and 1320(B) may be connected to augmented-reality system 1300 via a wireless connection (e.g., a Bluetooth connection). In still other embodiments, acoustic transducers 1320(A) and 1320(B) may not be used at all in conjunction with augmented-reality system 1300.

Acoustic transducers 1320 on frame 1310 may be positioned along the length of the temples, across the bridge, above or below display devices 1315(A) and 1315(B), or some combination thereof. Acoustic transducers 1320 may be oriented such that the microphone array is able to detect sounds in a wide range of directions surrounding the user wearing the augmented-reality system 1300. In some embodiments, an optimization process may be performed during manufacturing of augmented-reality system 1300 to determine relative positioning of each acoustic transducer 1320 in the microphone array.

In some examples, augmented-reality system 1300 may include or be connected to an external device (e.g., a paired device), such as neckband 1305. Neckband 1305 generally represents any type or form of paired device. Thus, the following discussion of neckband 1305 may also apply to various other paired devices, such as charging cases, smart watches, smart phones, wrist bands, other wearable devices, hand-held controllers, tablet computers, laptop computers, other external compute devices, etc.

As shown, neckband 1305 may be coupled to eyewear device 1302 via one or more connectors. The connectors may be wired or wireless and may include electrical and/or non-electrical (e.g., structural) components. In some cases, eyewear device 1302 and neckband 1305 may operate independently without any wired or wireless connection between them. While FIG. 13 illustrates the components of eyewear device 1302 and neckband 1305 in example locations on eyewear device 1302 and neckband 1305, the components may be located elsewhere and/or distributed differently on eyewear device 1302 and/or neckband 1305. In some embodiments, the components of eyewear device 1302 and neckband 1305 may be located on one or more additional peripheral devices paired with eyewear device 1302, neckband 1305, or some combination thereof.

Pairing external devices, such as neckband 1305, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1300 may be provided by a paired device or shared between a paired device and an eyewear device, thus reducing the weight, heat profile, and form factor of the eyewear device overall while still retaining desired functionality. For example, neckband 1305 may allow components that would otherwise be included on an eyewear device to be included in neckband 1305 since users may tolerate a heavier weight load on their shoulders than they would tolerate on their heads. Neckband 1305 may also have a larger surface area over which to diffuse and disperse heat to the ambient environment. Thus, neckband 1305 may allow for greater battery and computation capacity than might otherwise have been possible on a stand-alone eyewear device. Since weight carried in neckband 1305 may be less invasive to a user than weight carried in eyewear device 1302, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1305 may be communicatively coupled with eyewear device 1302 and/or to other devices. These other devices may provide certain functions (e.g., tracking, localizing, depth mapping, processing, storage, etc.) to augmented-reality system 1300. In the embodiment of FIG. 13, neckband 1305 may include two acoustic transducers (e.g., 1320(1) and 1320(J)) that are part of the microphone array (or potentially form their own microphone subarray). Neckband 1305 may also include a controller 1325 and a power source 1335.

Acoustic transducers 1320(1) and 1320(J) of neckband 1305 may be configured to detect sound and convert the detected sound into an electronic format (analog or digital). In the embodiment of FIG. 13, acoustic transducers 1320(1) and 1320(J) may be positioned on neckband 1305, thereby increasing the distance between the neckband acoustic transducers 1320(1) and 1320(J) and other acoustic transducers 1320 positioned on eyewear device 1302. In some cases, increasing the distance between acoustic transducers 1320 of the microphone array may improve the accuracy of beamforming performed via the microphone array. For example, if a sound is detected by acoustic transducers 1320(C) and 1320(D) and the distance between acoustic transducers 1320(C) and 1320(D) is greater than, e.g., the distance between acoustic transducers 1320(D) and 1320(E), the determined source location of the detected sound may be more accurate than if the sound had been detected by acoustic transducers 1320(D) and 1320(E).

Controller 1325 of neckband 1305 may process information generated by the sensors on neckband 1305 and/or augmented-reality system 1300. For example, controller 1325 may process information from the microphone array that describes sounds detected by the microphone array. For each detected sound, controller 1325 may perform a direction-of-arrival (DOA) estimation to estimate a direction from which the detected sound arrived at the microphone array. As the microphone array detects sounds, controller 1325 may populate an audio data set with the information.

In embodiments in which augmented-reality system 1300 includes an inertial measurement unit, controller 1325 may compute all inertial and spatial calculations from the IMU located on eyewear device 1302. A connector may convey information between augmented-reality system 1300 and neckband 1305 and between augmented-reality system 1300 and controller 1325. The information may be in the form of optical data, electrical data, wireless data, or any other transmittable data form. Moving the processing of information generated by augmented-reality system 1300 to neckband 1305 may reduce weight and heat in eyewear device 1302, making it more comfortable to the user.

Power source 1335 in neckband 1305 may provide power to eyewear device 1302 and/or to neckband 1305. Power source 1335 may include, without limitation, lithium ion batteries, lithium-polymer batteries, primary lithium batteries, alkaline batteries, or any other form of power storage. In some cases, power source 1335 may be a wired power source. Including power source 1335 on neckband 1305 instead of on eyewear device 1302 may help better distribute the weight and heat generated by power source 1335.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1400 in FIG. 14, that mostly or completely covers a user's field of view. Virtual-reality system 1400 may include a front rigid body 1402 and a band 1404 shaped to fit around a user's head. Virtual-reality system 1400 may also include output audio transducers 1406(A) and 1406(B). Furthermore, while not shown in FIG. 14, front rigid body 1402 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1300 and/or virtual-reality system 1400 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1300 and/or virtual-reality system 1400 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1300 and/or virtual-reality system 1400 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 14, output audio transducers 1406(A) and 1406(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 13, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 1300 and 1400 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 15:
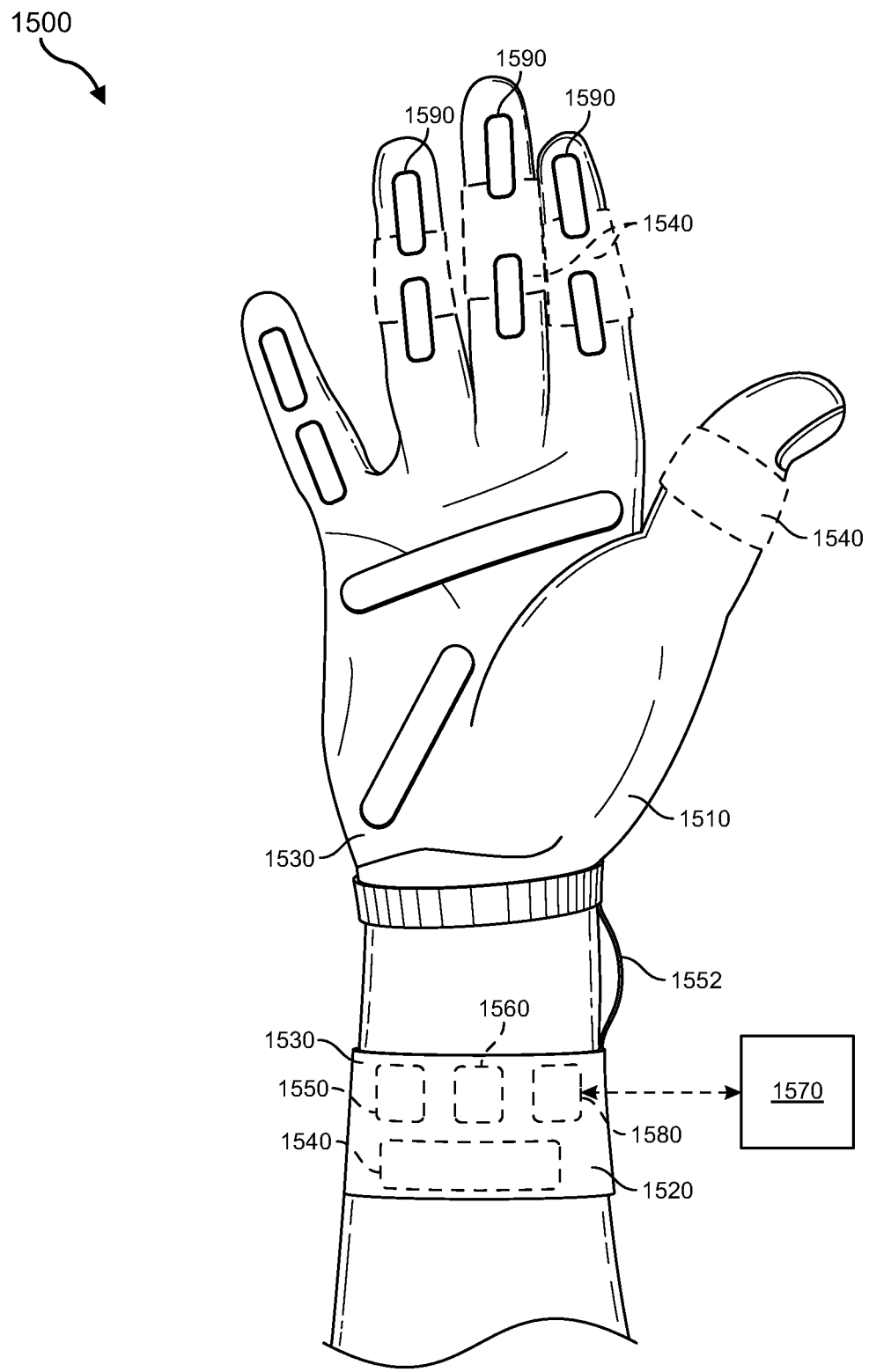
FIG. 15 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 15 illustrates a vibrotactile system 1500 in the form of a wearable glove (haptic device 1510) and wristband (haptic device 1520). Haptic device 1510 and haptic device 1520 are shown as examples of wearable devices that include a flexible, wearable textile material 1530 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1540 may be positioned at least partially within one or more corresponding pockets formed in textile material 1530 of vibrotactile system 1500. Vibrotactile devices 1540 may be positioned in locations to provide a vibrating sensation (e.g., haptic feedback) to a user of vibrotactile system 1500. For example, vibrotactile devices 1540 may be positioned against the user's finger(s), thumb, or wrist, as shown in FIG. 15. Vibrotactile devices 1540 may, in some examples, be sufficiently flexible to conform to or bend with the user's corresponding body part(s).

A power source 1550 (e.g., a battery) for applying a voltage to the vibrotactile devices 1540 for activation thereof may be electrically coupled to vibrotactile devices 1540, such as via conductive wiring 1552. In some examples, each of vibrotactile devices 1540 may be independently electrically coupled to power source 1550 for individual activation. In some embodiments, a processor 1560 may be operatively coupled to power source 1550 and configured (e.g., programmed) to control activation of vibrotactile devices 1540.

Vibrotactile system 1500 may be implemented in a variety of ways. In some examples, vibrotactile system 1500 may be a standalone system with integral subsystems and components for operation independent of other devices and systems. As another example, vibrotactile system 1500 may be configured for interaction with another device or system 1570. For example, vibrotactile system 1500 may, in some examples, include a communications interface 1580 for receiving and/or sending signals to the other device or system 1570. The other device or system 1570 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1580 may enable communications between vibrotactile system 1500 and the other device or system 1570 via a wireless (e.g., Wi-Fi, Bluetooth, cellular, radio, etc.) link or a wired link. If present, communications interface 1580 may be in communication with processor 1560, such as to provide a signal to processor 1560 to activate or deactivate one or more of the vibrotactile devices 1540.

Vibrotactile system 1500 may optionally include other subsystems and components, such as touch-sensitive pads 1590, pressure sensors, motion sensors, position sensors, lighting elements, and/or user interface elements (e.g., an on/off button, a vibration control element, etc.). During use, vibrotactile devices 1540 may be configured to be activated for a variety of different reasons, such as in response to the user's interaction with user interface elements, a signal from the motion or position sensors, a signal from the touch-sensitive pads 1590, a signal from the pressure sensors, a signal from the other device or system 1570, etc.

Although power source 1550, processor 1560, and communications interface 1580 are illustrated in FIG. 15 as being positioned in haptic device 1520, the present disclosure is not so limited. For example, one or more of power source 1550, processor 1560, or communications interface 1580 may be positioned within haptic device 1510 or within another wearable textile.

Figure 16:
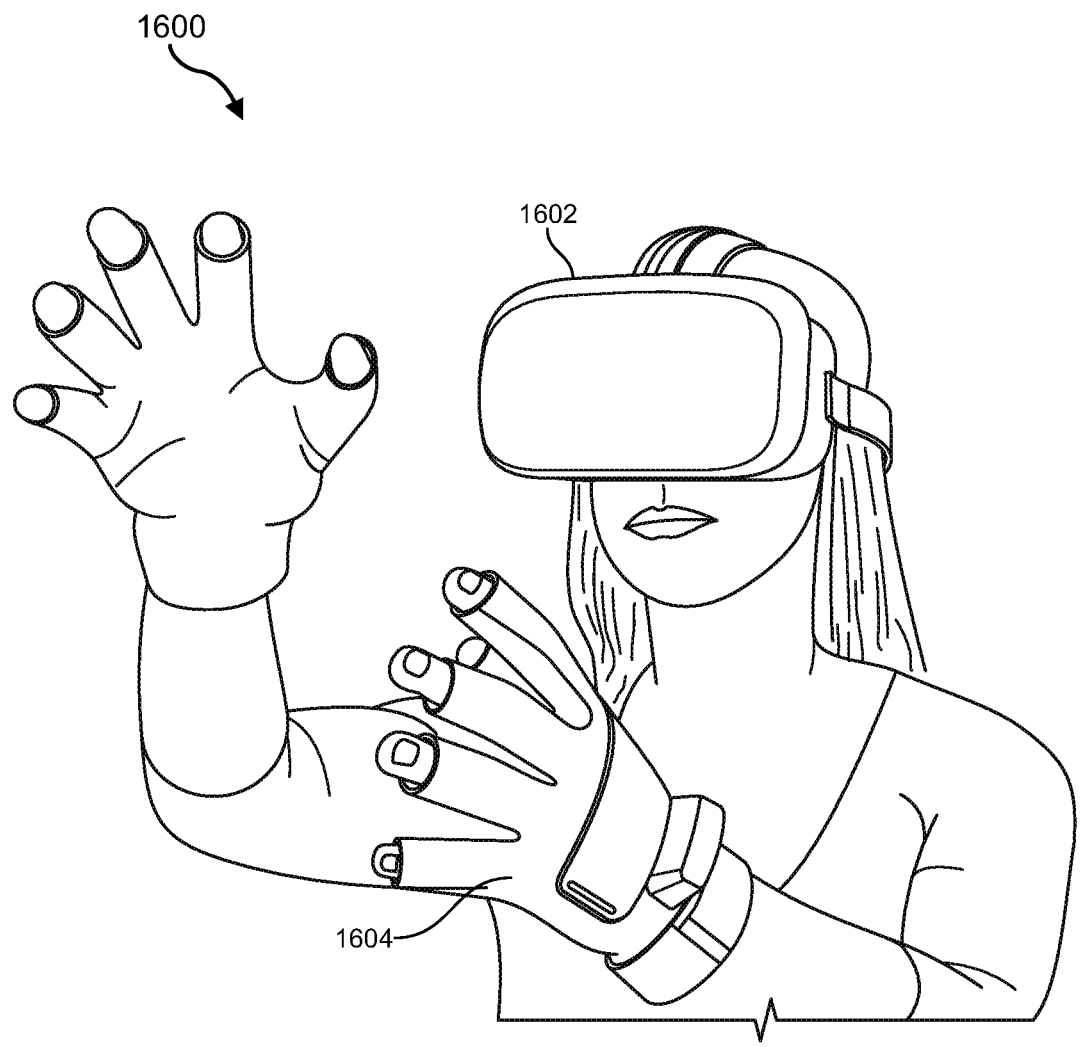
FIG. 16 is an illustration of an exemplary virtual-reality environment according to embodiments of this disclosure.

Haptic wearables, such as those shown in and described in connection with FIG. 15, may be implemented in a variety of types of artificial-reality systems and environments. FIG. 16 shows an example artificial-reality environment 1600 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 14:
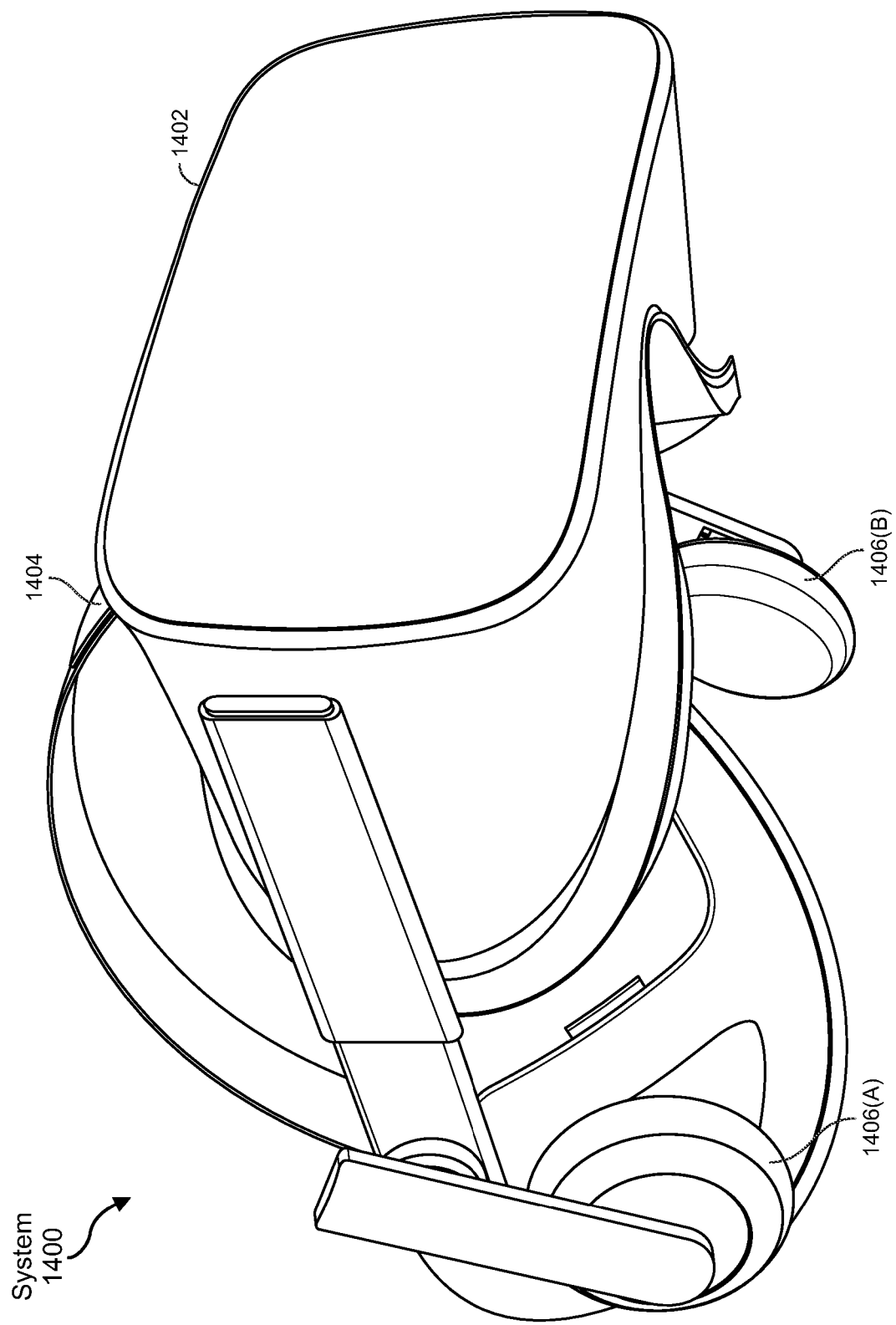
FIG. 14 is an illustration of an exemplary virtual-reality headset that may be used in connection with embodiments of this disclosure.

Head-mounted display 1602 generally represents any type or form of virtual-reality system, such as virtual-reality system 1400 in FIG. 14. Haptic device 1604 generally represents any type or form of wearable device, worn by a user of an artificial-reality system, that provides haptic feedback to the user to give the user the perception that he or she is physically engaging with a virtual object. In some embodiments, haptic device 1604 may provide haptic feedback by applying vibration, motion, and/or force to the user. For example, haptic device 1604 may limit or augment a user's movement. To give a specific example, haptic device 1604 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1604 to send action requests to a console. Examples of action requests include, without limitation, requests to start an application and/or end the application and/or requests to perform a particular action within the application.

Figure 17:
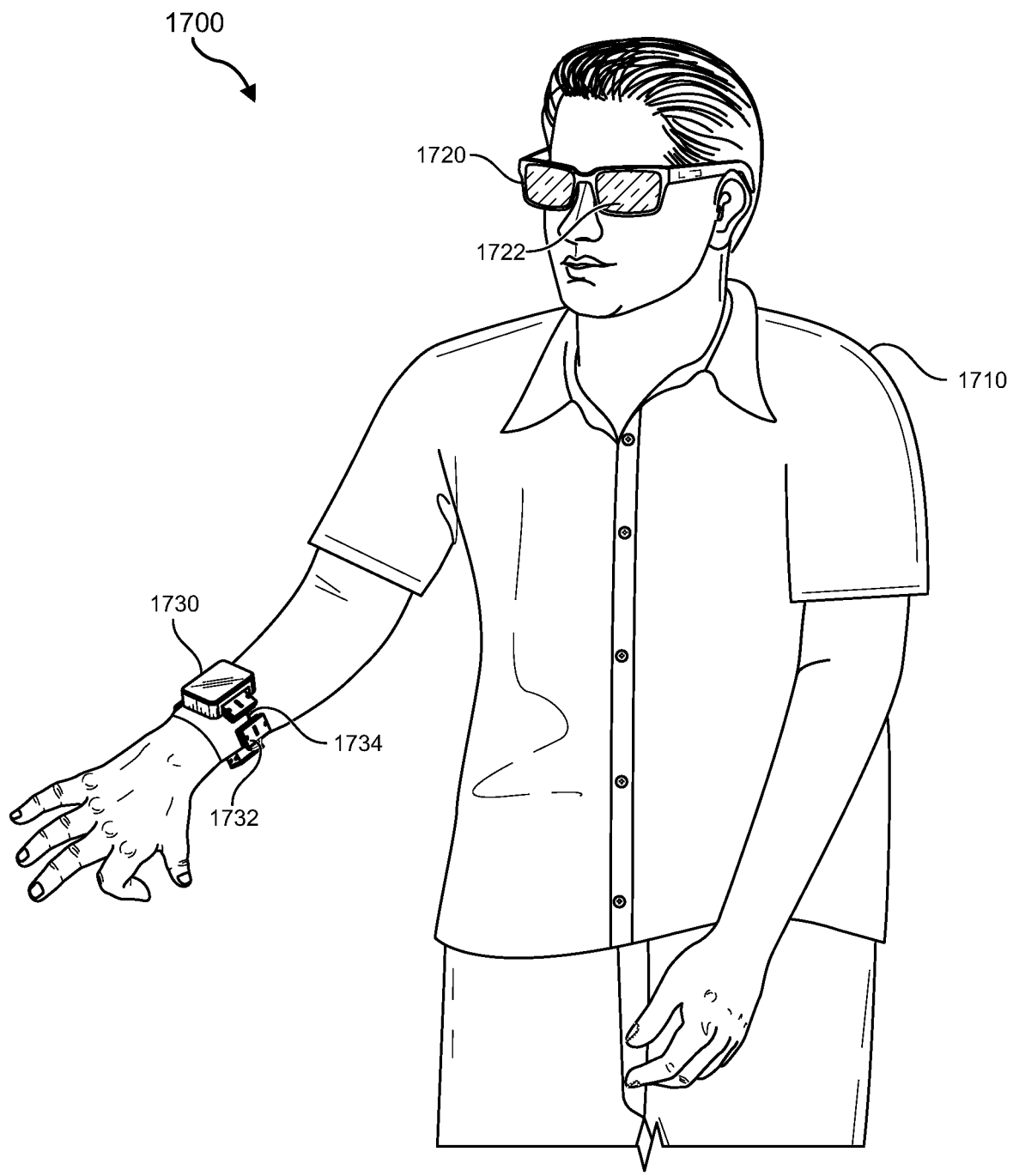
FIG. 17 is an illustration of an exemplary augmented-reality environment according to embodiments of this disclosure.

While haptic interfaces may be used with virtual-reality systems, as shown in FIG. 16, haptic interfaces may also be used with augmented-reality systems, as shown in FIG. 17. FIG. 17 is a perspective view of a user 1710 interacting with an augmented-reality system 1700. In this example, user 1710 may wear a pair of augmented-reality glasses 1720 that may have one or more displays 1722 and that are paired with a haptic device 1730. In this example, haptic device 1730 may be a wristband that includes a plurality of band elements 1732 and a tensioning mechanism 1734 that connects band elements 1732 to one another.

One or more of band elements 1732 may include any type or form of actuator suitable for providing haptic feedback. For example, one or more of band elements 1732 may be configured to provide one or more of various types of cutaneous feedback, including vibration, force, traction, texture, and/or temperature. To provide such feedback, band elements 1732 may include one or more of various types of actuators. In one example, each of band elements 1732 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1510, 1520, 1604, and 1730 may include any suitable number and/or type of haptic transducer, sensor, and/or feedback mechanism. For example, haptic devices 1510, 1520, 1604, and 1730 may include one or more mechanical transducers, piezoelectric transducers, and/or fluidic transducers. Haptic devices 1510, 1520, 1604, and 1730 may also include various combinations of different types and forms of transducers that work together or independently to enhance a user's artificial-reality experience. In one example, each of band elements 1732 of haptic device 1730 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a packaging layer that comprises or includes silicone include embodiments where a packaging layer consists essentially of silicone and embodiments where a packaging layer consists of silicone.

What is claimed is:

1. A system comprising:
   an optical transformer configured to generate a voltage output of at least 100 volts; and
   a voltage driven device, wherein the optical transformer is located proximate to the voltage driven device at a distance less than a linear dimension of the voltage driven device.

2. The system of claim 1, wherein the optical transformer comprises a light source optically coupled to a photovoltaic cell.

3. The system of claim 2, wherein the light source comprises a surface-emitting device or an edge-emitting device.

4. The system of claim 1, wherein the optical transformer is mounted directly over the voltage driven device.

5. The system of claim 1, further comprising a flexible layer between the optical transformer and the voltage driven device.

6. The system of claim 1, further comprising a thermally-insulating layer between the optical transformer and the voltage driven device.

7. The system of claim 1, wherein the optical transformer is flexible.

8. The system of claim 7, wherein the optical transformer is mounted directly over a curved surface of the voltage driven device.

9. The system of claim 1, further comprising:
   a voltage connection electrically coupling the optical transformer to the voltage driven device;

a voltage source configured to control the optical transformer; and a voltage connection electrically coupling the voltage source to the optical transformer.

10. The system of claim 9, wherein the voltage source is electrically isolated from the voltage connection.

11. The system of claim 9, wherein a length of the voltage connection is less than a length of the voltage connection.

12. The system of claim 1, wherein the voltage driven device comprises a liquid lens.

13. The system of claim 1, comprising a plurality of optical transformers and a plurality of voltage driven devices, wherein each voltage driven device is directly mounted to a respective optical transformer.

14. A head-mounted display comprising the system of claim 1.

15. A system comprising:

a plurality of voltage driven devices, each voltage driven device comprising a corresponding optical transformer, configured to generate a voltage output of at least 100 volts, mounted directly thereto.

16. The system of claim 15, wherein at least one of the optical transformers is flexible.

17. The system of claim 15, further comprising:

a voltage connection electrically coupling each optical transformer to each respective voltage driven device;

a voltage source configured to control each optical transformer; and a voltage connection electrically coupling the voltage source to each optical transformer.

18. The system of claim 17, wherein the voltage source is electrically isolated from the voltage connection.

19. A method comprising:

forming an optical transformer, configured to generate a voltage output of at least 100 volts, directly over a voltage driven device.

20. The method of claim 19, wherein the optical transformer is formed directly over a non-planar surface of the voltage driven device.

* * * * *